United States Patent
Lin et al.

(10) Patent No.: US 6,518,153 B1
(45) Date of Patent: Feb. 11, 2003

(54) METHOD FOR MAKING GATE ELECTRODES OF LOW SHEET RESISTANCE FOR EMBEDDED DYNAMIC RANDOM ACCESS MEMORY DEVICES

(75) Inventors: Chi-hui Lin, Taipei (TW); Chung Lin Huang, Taichung (TW)

(73) Assignee: Nanya Technology Corporation (TW)

( * ) Notice: Subject to any disclaimer, the term of this patent is extended or adjusted under 35 U.S.C. 154(b) by 0 days.

(21) Appl. No.: 09/562,911

(22) Filed: May 2, 2000

(30) Foreign Application Priority Data

Jun. 10, 1999 (TW) ........................ 88109685 A

(51) Int. Cl.[7] ........................ H01L 91/3205
(52) U.S. Cl. ................ 438/585; 438/586; 438/592; 438/595; 438/597; 438/648; 438/649; 257/368; 257/383; 257/384
(58) Field of Search ................ 438/585, 586, 438/588, 592, 595, 597, 369, 300; 257/413, 412, 900, 649

(56) References Cited

U.S. PATENT DOCUMENTS

| | | | | |
|---|---|---|---|---|
| 4,755,478 A | * | 7/1988 | Abernathey et al. | 438/585 |
| 5,352,631 A | * | 10/1994 | Sitaram et al. | 438/300 |
| 5,686,331 A | * | 11/1997 | Song | 438/303 |
| 6,107,131 A | * | 4/2000 | Huang | 438/238 |
| 6,110,818 A | * | 8/2000 | Haskell | 438/621 |
| 6,208,004 B1 | * | 3/2001 | Cunningham | 257/413 |
| 6,214,676 B1 | * | 4/2001 | Jun et al. | 438/279 |
| 6,225,155 B1 | * | 5/2001 | Lin et al. | 438/230 |
| 6,271,123 B1 | * | 8/2001 | Jang et al. | 438/633 |
| 6,136,677 A1 | * | 10/2001 | Prein | 438/592 |

OTHER PUBLICATIONS

S. Wolf, Silicon Processing for the VLSI Era, vol. 2—Process Integration, Jan. 1990, pp201–204.*

* cited by examiner

*Primary Examiner*—Matthew Smith
*Assistant Examiner*—Belur Keshavan
(74) *Attorney, Agent, or Firm*—Lowe Hauptman Gilman & Berner, LLP

(57) ABSTRACT

A method of making embedded DRAM devices having integrated therein a gate electrode of low sheet resistance satisfying the requirement of high performance logic circuitry is provided. The gate electrode on a semiconductor substrate comprises a gate oxide film, a polysilicon film, a metal, a lightly doped diffusion layer, silicon dioxide spacers, and a source/drain diffusion layer. The metal is planted in an opening, where a capped silicon nitride used to occupy, on top the polysilicon film.

17 Claims, 4 Drawing Sheets

METHOD FOR MAKING GATE ELECTRODES OF LOW SHEET RESISTANCE FOR EMBEDDED DYNAMIC RANDOM ACCESS MEMORY DEVICES

BACKGROUND OF THE INVENTION

1. Field of the Invention

This invention relates to a method for fabricating gate electrodes of semiconductor integrated circuits, and more particularly, to a method of forming gate electrodes of low sheet resistance for embedded dynamic random access memory (DRAM) devices.

2. Description of the Prior Art

Advances in the semiconductor process technologies have significantly reduced the device feature size and increased the circuit density and performance on semiconductor chips. Incorporation of both logic and memory circuitry on a semiconductor chip has become a critical issue in the semiconductor industry. For example, Sung in U.S. Pat. No. 5,858,831 discloses a process for fabricating such logic and embedded DRAM device on a single semiconductor chip.

A metal oxide semiconductor (MOS) transistor element uses a gate electrode to control the output voltage thereof. Metals of low resistivity have been widely applied to form the gate electrode of a MOS field effect transistor (FET) that is used extensively for Ultra Large Scale Integration (ULSI). When the length of gate electrode is more than 2 μm, aluminum is the very popular material for making the gate electrode of FET throughout the industry. As the semiconductor technology evolves into the sub-micron era, polysilicon replaces the conventional low resistance metals for making the gate electrode of FET with suitable threshold voltage. Recently, polycide structure composed of polysilicon and a transition metal silicide and salicide (self-aligned silicide) process are commonly used to reduce the sheet resistance of the gate electrode, as disclosed in Abernathey et al, U.S. Pat. No. 4,755,478, and Lang et al, U.S. Pat. No. 5,665,623.

In practice, the evolvement of semiconductor technologies has reduced the sheet resistance of the gate electrode from highly doped polysilicon of 45 Ω/square to tungsten silicide of 20 Ω/square and further to salicide of 10 Ω/square. However, the sheet resistance of the gate electrode is increased as electrical elements shrink. Therefore, there are currently a number of research projects for exploring a gate electrode of lower resistivity than 10 Ω/square to meet the development of high performance logic circuitry.

SUMMARY OF THE INVENTION

Accordingly, an object of the present invention is to provide a method for making gate electrodes of the FETs for embedded DRAM devices.

Another object of the present invention is to provide a method for making gate electrodes of low sheet resistance for embedded DRAM devices.

According to the present invention, a method of manufacturing a semiconductor device having a gate electrode of low sheet resistance comprising the steps of: defining active areas of MOS devices on a semiconductor substrate of one conductivity type and isolation regions spaced apart in the substrate; forming a first insulating film on the active areas; forming an electrode material on the first insulating film; forming a second insulating film used as a cap portion on the electrode material; patterning by the lithography technology and etching the second insulating film and the electrode material leaving portions over the active areas; forming lightly doped source/drain regions in the active areas by ion implantation; forming spacers on sidewalls of the electrode material and the second insulating film; forming source/drain diffusion regions; depositing an interlayer dielectric on the semiconductor substrate and etching back the dielectric layer to expose the second insulating layer; removing the second insulating film on the electrode material; and depositing a metal and removing the metal on the interlayer dielectric while leaving the metal on the electrode material.

BRIEF DESCRIPTION OF THE DRAWINGS

The objects and advantages of the present invention are best understood by the following embodiments with reference to the attached drawings which include.

DESCRIPTION OF THE PREFERRED EMBODIMENTS

According to the preferred embodiments of the present invention, gate electrodes of embedded DRAM memory device in logic circuitry are produced through the following steps as shown in FIGS. 1 through 7.

Figure 1:
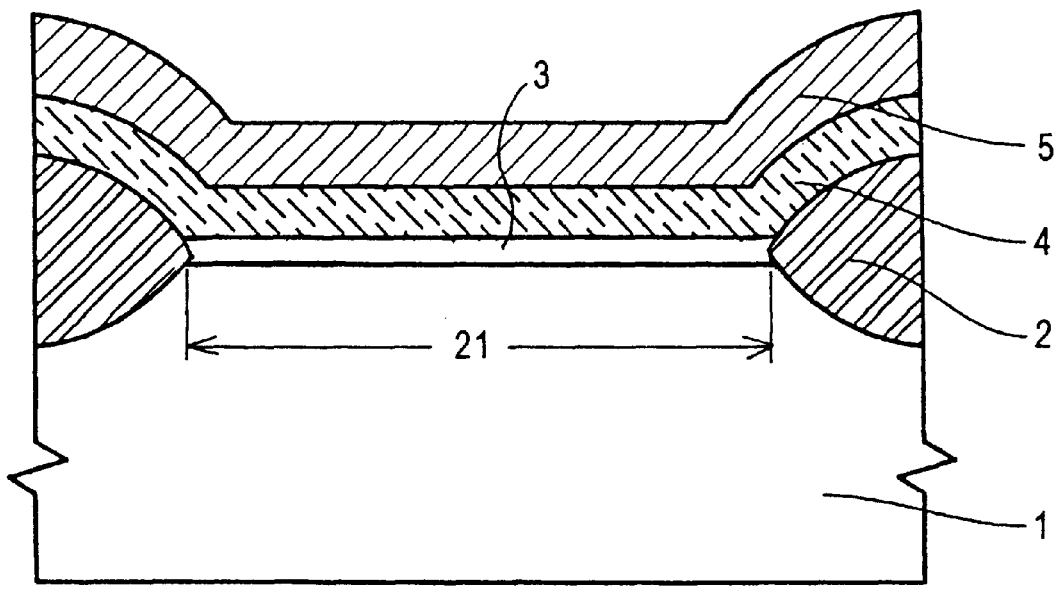
FIGS. 1 through 7 show in schematic cross sectional views the process sequence for making gate electrodes of an embedded DRAM memory device in accordance with the present invention.

To illustrate the process steps of the present invention, two FETs within an embedded circuit are formed on a substrate 1. The substrate 1 is a typical P+type, <100> sigle crystalline silicon wafer having a resistivity of 2 to 20 Ω-cm. As shown in FIG. 1, isolation regions 2 and active areas 21 are formed on the substrate 1. The isolation regions 2 surrounding the active areas 21 to electrically isolate the individual elements are formed by use of an element isolation method such as the normal Local Oxidation of Silicon (LOCOS) process or any of shallow trench isolation (STI) methods.

Still referring to FIG. 1, a thin gate oxide 3 of silicon dioxide is formed on the active areas 21 by dry oxidation. The thickness of oxide 3 is approximately 30 to 150 Angstrom. A polysilicon layer 4 is next formed on top of the gate oxide 3 by Low Pressure Chemical Vapor Deposition (LPCVD) to a thickness of approximately 1,000 to 2,000 Angstrom. To lower the resistivity of the polysilicon layer 4, the polysilicon layer 4 is usually heavy doped with a N type electrically conductive dopant, such as phosphorus (P) or arsenic (As), by in-situ during deposition, or by diffusion or ion implantation after deposition. After doping layer 4, a cap layer of 5 silicon nitride is formed on the polysilicon layer 4 also by LPCVD. The layer 5 is deposited to a thickness of approximately 1,000 to 2,000 Angstrom.

Figure 2:
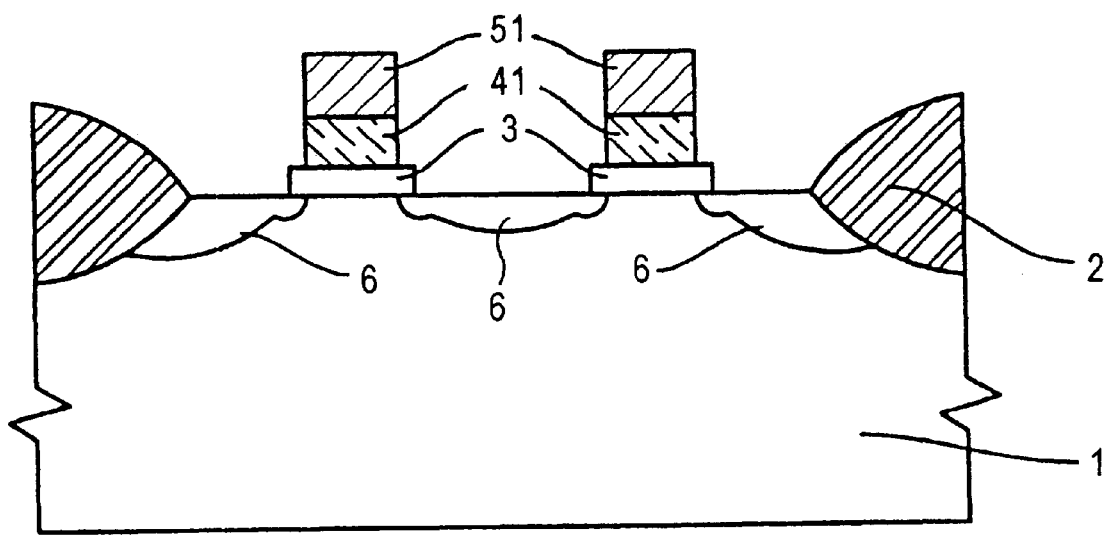

Referring next to FIG. 2, the cap layer of silicon nitride 5, polysilicon layer 4 and gate oxide 3 are patterned by the conventional lithography technology, and then sequentially dry etched to expose the surface of the substrate 1. This forms gate electrodes 41 for the FETs in the active areas 21. Lightly doped source/drain regions 6 are formed adjacent to the gate electrodes 41 by ion implantation.

Figure 3:
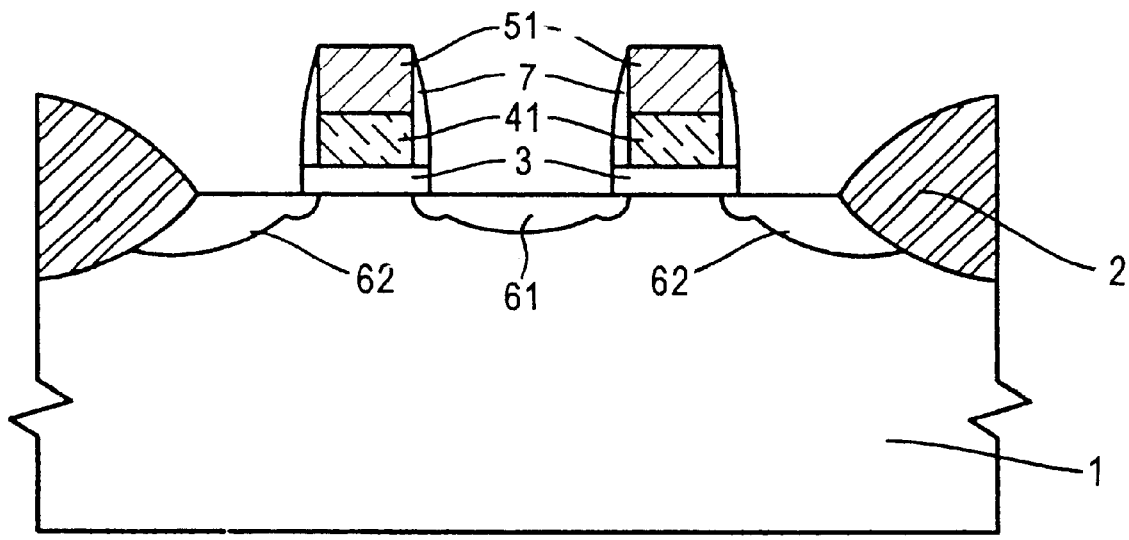

Referring to FIG. 3, after forming lightly doped source/drain region 6, sidewall spacers 7 are formed on the exposed sides of the gate oxide 3, the polysilicon portion 41 and the silicon nitride portion 51. The preferred method of forming the sidewall spacers 7 is to deposit a layer of silicon dioxide by CVD and then etch back anistropically to the surface of the substrate 1. After this, impurities of high concentration are ion-implanted to from source diffusion region 61 and drain diffusion regions 62.

Figure 4:
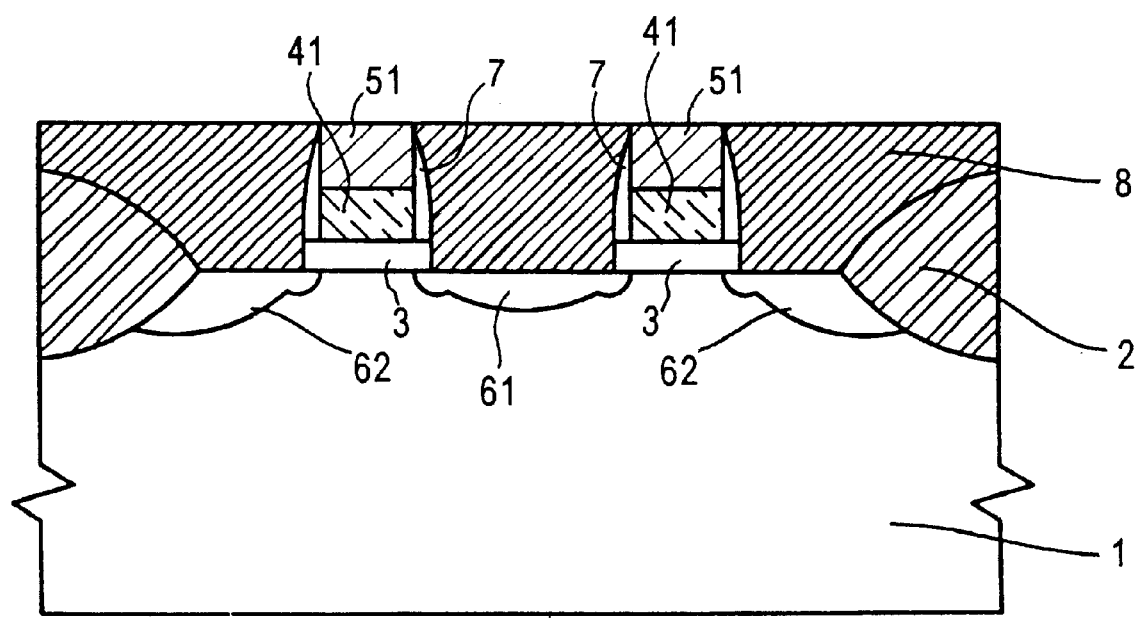

Continuing with the process and referring to FIG. 4, a relatively thick blanket layer 8, commonly referred to as an interlayer dielectric, which is preferably a CVD oxide, is deposited on the substrate 1 and over the polysilicon portion 41, the silicon nitride portion 51 and the spacers 7 by CVD. The dielectric layer 8 is then etch-backed by Chemical-Mechanical Polishing (CMP) to the silicon nitride portion 51 serving as a polishing stop layer for the CMP process.

Figure 5:
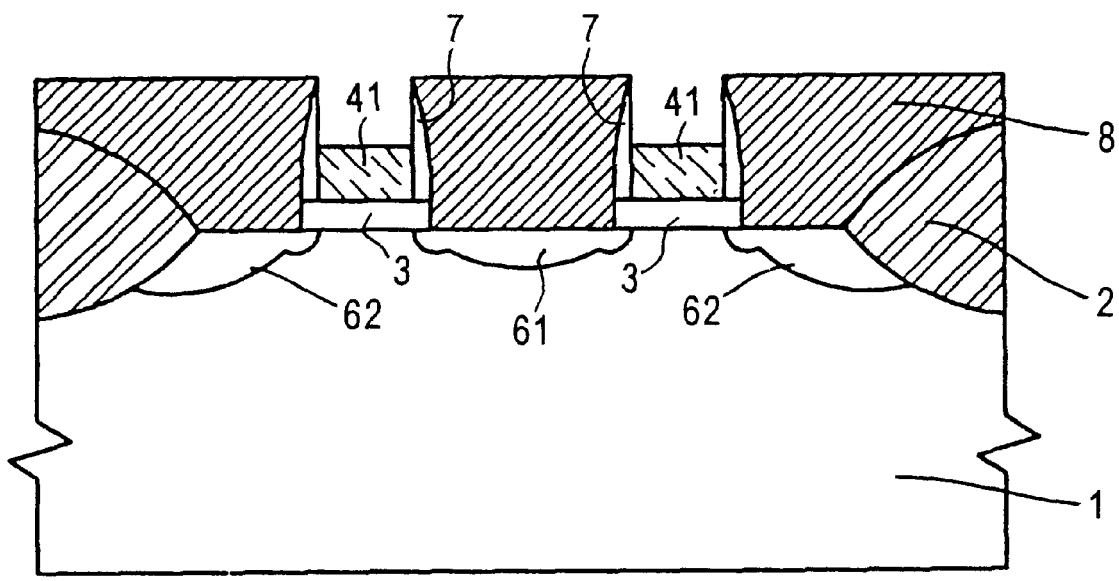

Referring now to FIG. 5, after CMP process, the silicon nitride portion 51 is isotropically etched with phosphoric acid at an etching rate of 50 Angstrom per minute so as to remove the silicon nitride portion 51 and expose the underlying portion of polysilicon 41 within the sidewall spacers 7.

Figure 6:
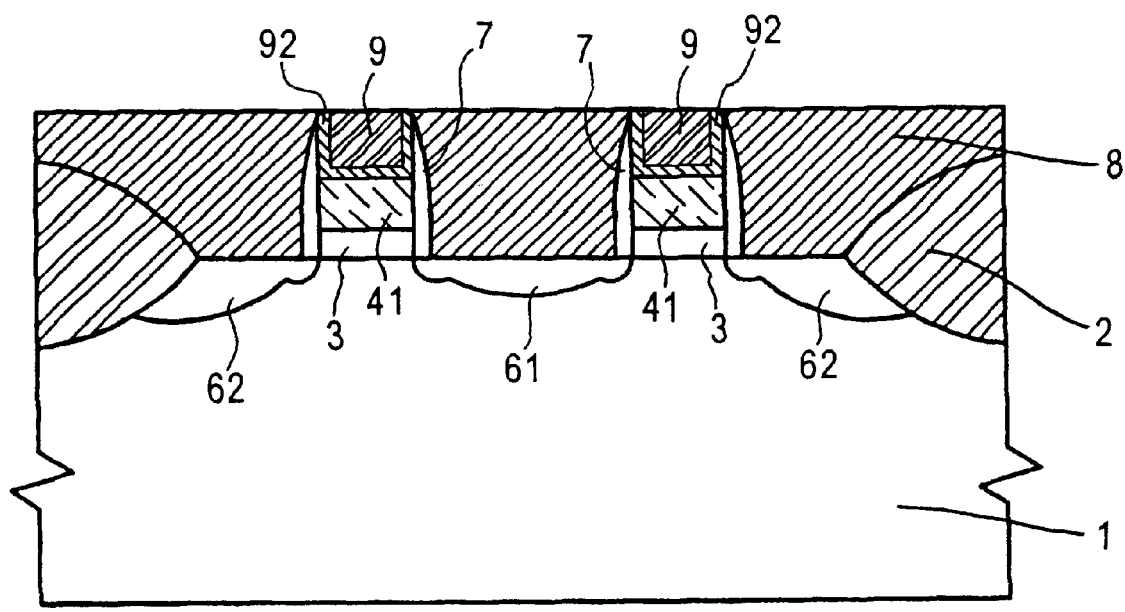

As shown in FIG. 6, a metal 9, such as Tungsten, is deposited within the opening defined by the polysilicon portion 41 and the sidewall spacers 7. Metal 9 is deposited preferably by CVD. After depositing the metal 9, CMP is used to polish off metal 9 on the interlayer dielectric 8, while leaving metal 9 only on polysilicon portion 41. As mentioned above, interlayer dielectric 8 serves as a polishing stop layer.

Figure 7:
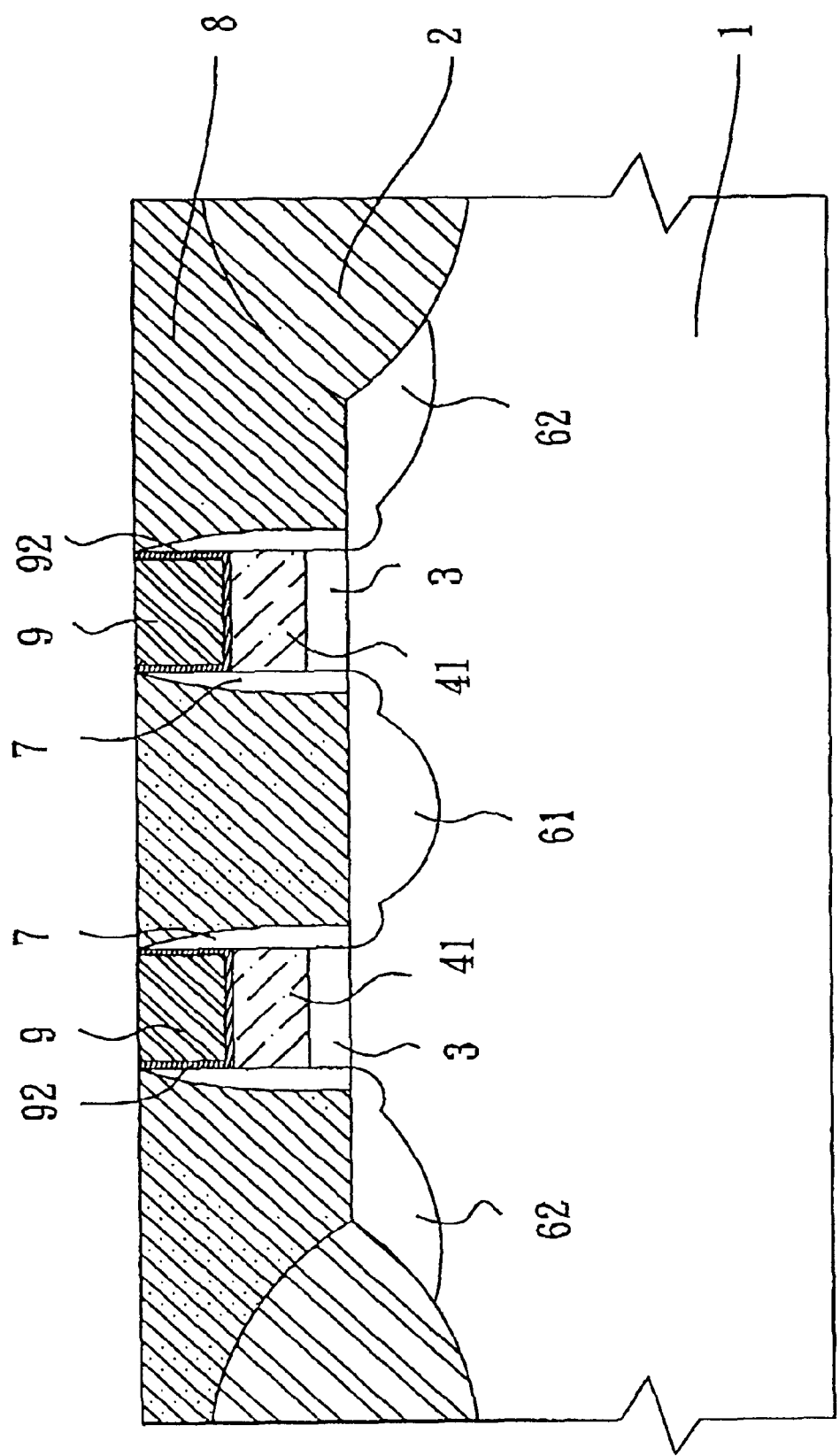

Further, in order to prevent reaction between Silicon and $WF_6$ during CVD process, a barrier layer 92 (as shown in FIG. 7) can optionally be provided prior to Tungsten deposition. The barrier layer can be conventional titanium nitride material and is formed by either CVD or Physical Vapor Deposition (PVD).

In a case where the sheet resistance of the control gate of an embedded DRAM in a memory array is approximately 40 to 50 $\Omega$/square while the logic circuitry in association with embedded DRAM requires a lower sheet resistance below 10 $\Omega$/square, the gate electrode of the FET in logic circuitry of the embedded DRAM can be formed in accordance with the present invention to have an additional metal layer on top of the original polysilicon to have a lower resistance. Another advantage of the present invention is that the silicon nitride cap remains on the polysilicon in the memory array results in self-aligned effectiveness for the subsequent contact etching processes.

While the invention has been particularly shown and described with reference to the preferred embodiment thereof, it will be understood by those skilled in the art that various changes in form and details may be made without departing the spirit and scope of the general inventive concept as defined by the appended claims and their equivalents.

What is claimed is:

1. A method for making gate electrodes of low sheet resistance for embedded DRAM devices, said method comprising the steps of:

forming isolation regions around active areas on a semiconductor substrate;

forming a first insulating film on said active areas;

forming an electrode material on said first insulating film;

forming a second insulating film on said electrode material;

patterning and etching said second insulating film, said electrode material and said first insulating film by lithography leaving predetermined portions over in said active areas;

forming lightly doped source/drain regions in said active areas by ion implantation;

forming spacers around exposed side walls of said electrode material and said second insulating film;

forming source/drain diffusion regions in said lightly doped source/drain regions;

depositing a blanket interlayer dielectric on said substrate and etching back said deposited interlayer dielectric to expose said second insulating film;

removing said exposed second insulating film to expose said electrode material while leaving said back-etched interlayer dielectric intact; and forming, after said removal of said exposed second insulating film, a metal layer on said exposed electrode material by depositing a metal on said exposed electrode material and etching back said metal.

2. The method of claim 1, wherein said electrode material is polysilicon, and said second insulating film is silicon nitride.

3. The method of claim 1, wherein said spacers are made of silicon dioxide.

4. The method of claim 1, wherein the said interlayer dielectric is non-doped CVD oxide or Boron doped CVD oxide or Boron/phosphorous doped CVD oxide.

5. The method of claim 1, wherein said etching back of said interlayer dielectric is done by chemical-mechanical polish (CMP).

6. The method of claim 5, wherein said second insulating film is silicon nitride and said silicon nitride serves as a polishing stop layer for the CMP process.

7. The method of claim 1, wherein said exposed second insulating film is removed by hot phosphoric acid.

8. The method of claim 1, wherein said metal is etched back by chemical-mechanical polish (CMP).

9. The method of claim 1, wherein a barrier layer is formed between said electrode material and said metal to prevent reaction between said electrode material and said metal.

10. The method of claim 9, wherein the barrier layer is made of titanium nitride.

11. The method of claim 10, wherein the barrier layer is deposited on said exposed electrode material prior to said deposition of said metal.

12. The method of claim 1, wherein said metal is a material of low resistivity selected from the group consisting of tungsten, aluminum, platinum, copper and gold.

13. The method of claim 1, wherein said metal is molybdenum.

14. The method of claim 1, wherein said removal of said second insulating film results in a cavity defined by said spacers and said exposed electrode material, and said cavity is completely filled when said formation of said metal layer has been complete.

15. The method of claim 14, wherein said cavity is completely filled with said metal.

16. The method of claim 14, wherein a barrier layer is deposited in said cavity prior to said deposition of said metal to form a barrier between said electrode material and said metal; and said cavity is completely filled with said metal and said barrier layer.

17. The method of claim 16, wherein the barrier layer is made of titanium nitride.

* * * * *